United States Patent
Umemura

(10) Patent No.: US 8,497,974 B2
(45) Date of Patent: Jul. 30, 2013

(54) EXHAUST APPARATUS, PROCESSING APPARATUS, AND DEVICE MANUFACTURING METHOD

(75) Inventor: Atsushi Umemura, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 749 days.

(21) Appl. No.: 12/640,095

(22) Filed: Dec. 17, 2009

(65) Prior Publication Data

US 2010/0167216 A1    Jul. 1, 2010

(30) Foreign Application Priority Data

Dec. 25, 2008   (JP) ................ 2008-330368

(51) Int. Cl.
*G03B 27/52* (2006.01)
*G03B 27/54* (2006.01)
*G03B 27/32* (2006.01)
*G03B 27/68* (2006.01)
*G03B 27/60* (2006.01)
*G03B 27/64* (2006.01)

(52) U.S. Cl.
USPC ............ 355/30; 355/52; 355/67; 355/73; 355/76; 355/77

(58) Field of Classification Search
USPC ......... 355/30, 52, 53, 55, 67–71, 73, 76, 355/77; 250/492.1, 492.2, 492.22, 493.1, 250/548
See application file for complete search history.

(56) References Cited

U.S. PATENT DOCUMENTS

| | | | | | |
|---|---|---|---|---|---|
| 2,291,054 | A | * | 7/1942 | Nelson | 417/153 |
| 5,062,271 | A | * | 11/1991 | Okumura et al. | 62/55.5 |
| 5,259,735 | A | * | 11/1993 | Takahashi et al. | 417/203 |
| 5,305,364 | A | * | 4/1994 | Mochiji et al. | 378/34 |
| 6,031,598 | A | * | 2/2000 | Tichenor et al. | 355/67 |
| 6,369,874 | B1 | * | 4/2002 | del Puerto | 355/30 |
| 6,891,172 | B2 | * | 5/2005 | Ohgushi et al. | 250/492.2 |
| 6,897,456 | B2 | * | 5/2005 | Hasegawa et al. | 250/492.2 |
| 7,274,431 | B2 | | 9/2007 | Box | |
| 7,502,095 | B2 | * | 3/2009 | Jacobs et al. | 355/30 |
| 2003/0016780 | A1 | * | 1/2003 | Matsuo et al. | 378/34 |
| 2004/0035570 | A1 | * | 2/2004 | Hara | 165/289 |
| 2004/0080727 | A1 | * | 4/2004 | Emoto | 355/30 |
| 2004/0100623 | A1 | * | 5/2004 | Bisschops | 355/53 |
| 2004/0179178 | A1 | * | 9/2004 | Emoto | 355/53 |
| 2004/0262541 | A1 | * | 12/2004 | Honda et al. | 250/492.2 |
| 2005/0018157 | A1 | * | 1/2005 | Box et al. | 355/30 |
| 2005/0099611 | A1 | * | 5/2005 | Sogard | 355/30 |
| 2005/0168712 | A1 | * | 8/2005 | Miyajima | 355/30 |
| 2006/0181689 | A1 | * | 8/2006 | Phillips et al. | 355/53 |

(Continued)

FOREIGN PATENT DOCUMENTS

| | | |
|---|---|---|
| JP | 2005-020009 | 1/2005 |
| JP | 2008-251979 A | 10/2008 |
| JP | 2010-129687 A | 6/2010 |

*Primary Examiner* — Toan Ton
*Assistant Examiner* — Christina Riddle
(74) *Attorney, Agent, or Firm* — Canon USA Inc IP Division

(57) ABSTRACT

An exhaust apparatus includes a structural member; a vacuum pump configured to exhaust a gas via the structural member; and a regulator configured to regulate a temperature of the structural member. The structural member has first and second end faces and a columnar through hole connecting the first and second end faces to each other. The apparatus is configured such that the vacuum pump exhausts a gas via the through hole.

13 Claims, 8 Drawing Sheets

U.S. PATENT DOCUMENTS

| | | |
|---|---|---|
| 2007/0115444 A1* | 5/2007 | Miyazaki .................... 355/30 |
| 2008/0240905 A1* | 10/2008 | Sugawara et al. .......... 415/121.2 |
| 2010/0055623 A1* | 3/2010 | Namba ...................... 430/325 |
| 2012/0148746 A1* | 6/2012 | Honda et al. ............. 427/255.28 |

* cited by examiner

EXHAUST APPARATUS, PROCESSING APPARATUS, AND DEVICE MANUFACTURING METHOD

BACKGROUND OF THE INVENTION

1. Field of the Invention

The present invention relates to an exhaust apparatus including a vacuum pump.

2. Description of the Related Art

In recent years, there is a demand for, for example, semiconductor devices to be more precise and accurate. In satisfying this demand, one task is to reduce the influence of gas molecules and particles existing in the atmosphere in a manufacturing step, such as an exposure step.

These particles and gas molecules and compounds thereof adhere to the interior of an apparatus or to a processing object, thereby reducing the performance of the apparatus and the quality of a product. If confined to semiconductor exposure apparatuses, light having short wavelengths, as typified by EUV (extreme ultraviolet) light, is considerably attenuated in the atmosphere, thereby making it difficult to obtain a predetermined light quantity.

To solve these various problems, research of ultrafine processing under a high vacuum environment has been conducted. If the interior of a vessel is set to a highly vacuous state, the number of particles or molecules existing in the atmosphere is relatively small. Therefore, the amount of contaminant adhered to the interior of the apparatus and the processing object is reduced. In addition, since the transmittance of the light having short wavelengths is considerably increased, light having extremely short wavelengths, such as EUV light, can be used.

In a device manufacturing step such as that described above, thermal deformation of a manufacturing apparatus and the processing object influences the quality of the product. Therefore, a temperature control technology becomes important. For example, for an exposure apparatus using EUV light, when the temperature varies due to transfer of heat by, for example, radiation, optical performance may be reduced due to deformation of an optical element (such as a mirror), a member holding the optical element, etc. Therefore, in vacuum vessels including heat sources related to quadrupole mass analyzers or other measuring devices or vacuum pumps (such as turbo molecular pumps), reducing the influence of heat is very important.

Under a high vacuum environment, temperature control making use of convection of heat as in atmospheric environment cannot be performed. Movement of heat is dominated by conduction and radiation. In particular, regarding radiation, since heat is also transferred to an object that is separated through a space, it is desirable that the influence of this heat be reduced.

For intercepting the radiation of heat from a heat source, providing an intercepting member that intercepts the radiation from the heat source is known (Japanese Patent Laid-Open No. 2005-020009). Japanese Patent Laid-Open No. 2005-020009 discusses performing an exhaust operation while intercepting the radiation of heat through a louver in order to reduce the influence of the radiation of heat from a vacuum pump.

The heat radiation intercepting member discussed in Japanese Patent Laid-Open No. 2005-020009 is such that an exhaust path forming the louver is bent and has a shape allowing it to shield the vacuum pump when expected from a side facing the vacuum pump. That is, the intercepting member whose exhaust path is bent can perform the exhaust operation while intercepting the radiation of heat moving straight from the vacuum pump. However, since the exhaust path is bent, particles and gas molecules collide at least once with a surface of the intercepting member. Therefore, the intercepting member discussed in Japanese Patent Laid-Open No. 2005-020009 is not desirable in terms of exhaust efficiency.

SUMMARY OF THE INVENTION

The present invention provides, for example, an exhaust apparatus that is advantageous in terms of radiation heat shielding and exhaust efficiency.

According to the present invention, there is provided an exhaust apparatus comprising a structural member; a vacuum pump configured to exhaust a gas via the structural member; and a first regulator configured to regulate a temperature of the structural member, wherein the structural member has first and second end faces and a columnar through hole connecting the first and second end faces to each other, and wherein the apparatus is configured such that the vacuum pump exhausts a gas via the through hole.

According to the present invention, for example, an exhaust apparatus that is advantageous in terms of radiation heat shielding and exhaust efficiency can be provided.

Other objects and advantages besides those discussed above shall be apparent to those skilled in the art from the description of preferred embodiments of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
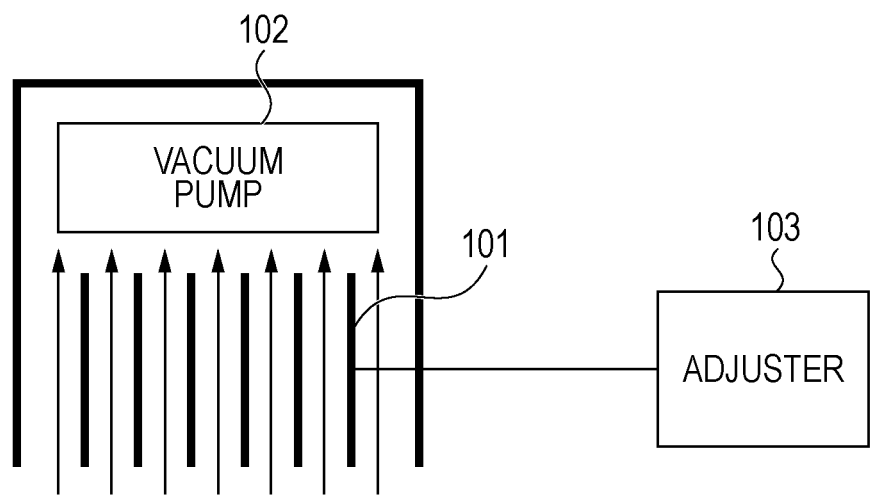
FIG. 1 is a sectional view of an exemplary exhaust apparatus.
Figure 2:
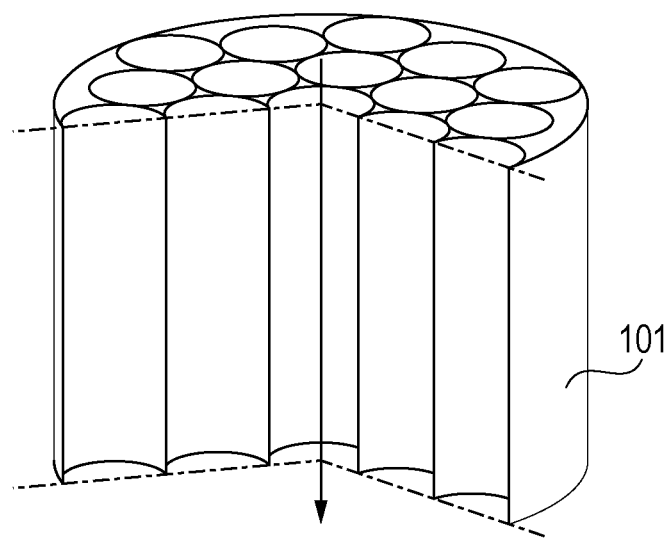
FIG. 2 is a sectional view of an exemplary structural member.
Figure 3:
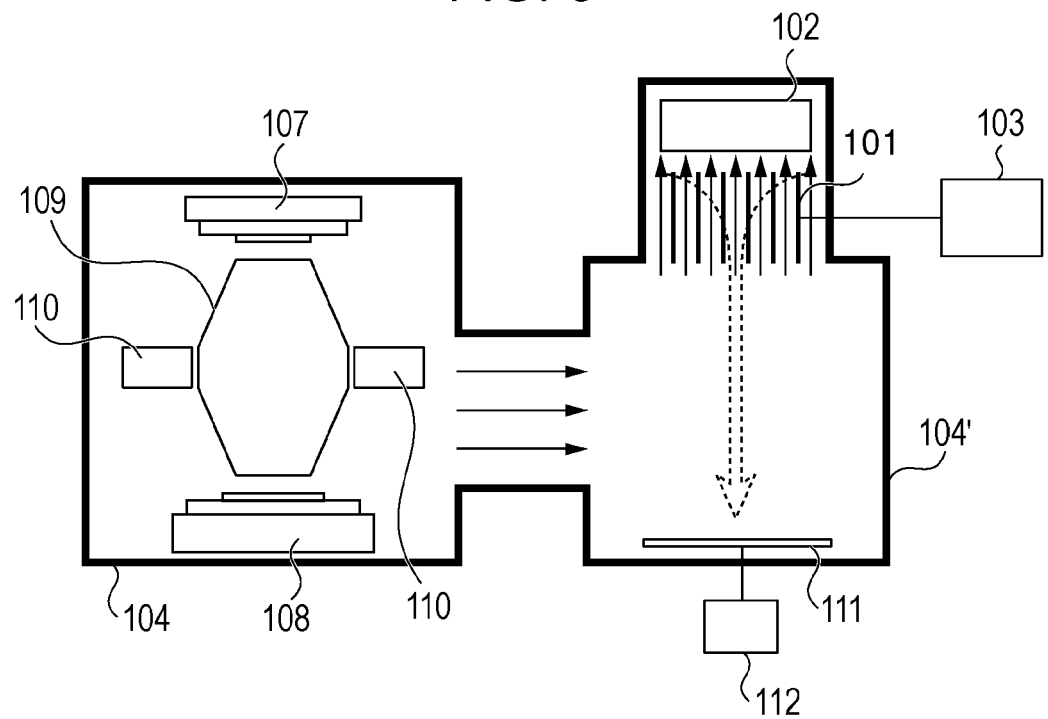
FIG. 3 shows an exemplary structure of a processing apparatus (exposure apparatus).

FIGS. 1, 2, and 3 show an exemplary vacuum exposure apparatus (that is, an exposure apparatus in which a pattern is transferred onto a substrate by exposing the substrate in a vacuum atmosphere) to which the present invention is applied. Reference numeral 104 denotes a vacuum vessel, and reference numeral 104' denotes an exhaust vessel connected to the vacuum vessel 104. Reference numeral 104' denotes an exhaust vessel for convenience, and actually denotes a vacuum vessel. The vacuum vessel 104 and the exhaust vessel 104' are directly connected to each other, or are connected to each other through, for example, a pipe member. The vacuum vessel 104 and the exhaust vessel 104' may be integrated to each other and formed as one vessel or may be separable from each other. The vacuum vessel 104 accommodates, for example, a reticle stage 107, a wafer stage 108, a projection system 109 (also called a projection optical system) that projects radiant energy onto the substrate. The reticle stage 107, the wafer stage 108, and the projection system 109 constitute a processing device. The projection optical system 109 is supported by a base 110. The radiant energy may be provided by ultraviolet rays, EUV light, X rays, or particle beams such as electronic beams. The exposure apparatus is an example of a processing apparatus. It may be any other type of processing apparatus including a processing device that processes objects under a vacuum environment. In the exhaust vessel 104', reference numeral 111 denotes a heat recovering plate (provided near an inner wall surface of the exhaust vessel 104') and reference numeral 112 denotes a temperature regulator (second regulating device) that regulates the temperature of the heat recovering plate 111. The heat recovering plate 111 and the temperature regulator 112 may be provided when necessary, and should be provided at locations that minimize reduction of exhaust efficiency of an exhaust apparatus (reference numerals 101 to 103) discussed later.

Reference numeral 101 denotes a structural member that has a columnar through hole that is not bent (such as a hollow circular cylinder), and that is used for performing an exhaust operation in the exhaust vessel 104' through the through hole. The pressure in the exhaust vessel 104' is reduced, so that the pressure in the vacuum vessel 104 is also reduced.

Reference numeral 102 denotes a vacuum pump, which is provided for reducing the pressure (air pressure) in the vacuum vessel 104 or the exhaust vessel 104' to, for example, approximately 10 e-3 Pa or below. The vacuum pump may be, for example, a turbo molecular pump or a cryodevice (cryopump).

In a vacuum state of approximately 10 e-3 Pa or below, movement of heat by convection no longer occurs. Therefore, heat generated at the vacuum pump 102 is transferred by conduction or radiation, and can move to an element (such as the projection optical system 109, etc.) in the vacuum vessel. Here, the vacuum vessel 104, the exhaust vessel 104', and the elements disposed in these vessels 104 and 104' ordinarily have their temperatures controlled. The transfer of heat from the vacuum pump 102 to the elements (such as the projection optical system 109) in the vacuum vessel 104 is primarily by radiation.

Figure 4:
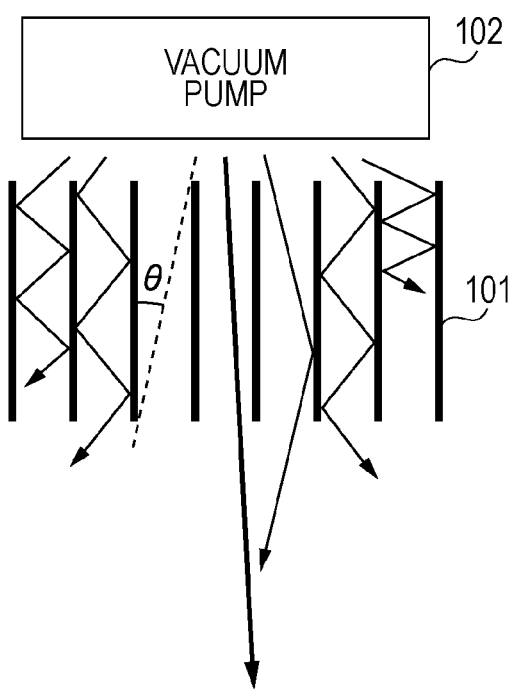
FIG. 4 illustrates the operation of the structural member.

FIG. 4 schematically shows the relationship between the vacuum pump 102 and the structural member 101. θ denotes an angle indicating a ratio (also called opening size ratio) between the size of the opening of the through hole of the structural member and the length in an axial direction of the through hole of the structural member 101. The radiation of the heat generated from the vacuum pump 102 moves straight through the through hole of the structural member 101, or interacts with an inner wall surface of the structural member 101. At the inner wall surface, the heat radiation is absorbed and reflected. The interaction that occurs at the inner wall surface will be described below.

Figure 5:
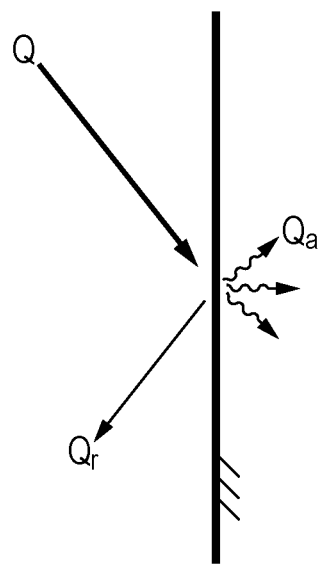
FIG. 5 illustrates specular reflection/absorption for heat radiation at a smooth surface.

FIG. 5 schematically shows a state in which heat is absorbed/reflected at a surface that is ideally smooth and that is opaque to visible light. Here, the sum of reflected heat Qr and absorbed heat Qa is equal to incident heat Q. The ratio between Qr and Qa is dominated by emissivity ε at each point of a member surface, so that $\epsilon = Qa/(Qr+Qa)$ is established.

Figure 6:
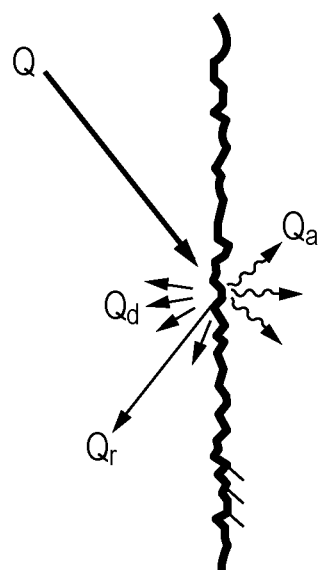
FIG. 6 illustrates specular reflection/diffuse reflection/absorption for heat radiation at a rough surface.

However, depending upon local surface states of the member at which the through hole of the structural member 101 is formed, the behavior of the reflection changes. If the ideally smooth state is realized as shown in FIG. 5, specular reflection in which the incident angle and the reflection angle are generally equal to each other only occurs. However, ordinarily, a specular reflection component Qr and a diffuse reflection component Qd are produced as shown in FIG. 6. Here, the incident heat Q is described as being equal to the total sum of Qr, Qd, and Qa.

The heat Qa absorbed at the inner wall surface of the through hole is emitted by being radiated again in addition to being diffused by heat conduction. The intensity of the radiated heat that is emitted is defined by its mutual relationship with a surrounding environment in which the intensity is considered. As long as the structural member 101 does not actively generate heat, the intensity of the radiated heat at least becomes small with respect to the incident heat Q.

The heat is repeatedly absorbed/dissipated at the inner wall surface of the through hole. Radiation whose incident angle with respect to the inner wall surface of the through hole (that is, an angle formed by a vector in a direction of incident radiation and a vector that is normal to the inner wall surface) is small is absorbed/reflected again at other points of the inner wall surface of the through hole, so that its intensity is gradually reduced. As a result, the heat radiation that has passed through the structural member 101 is such that a portion of the radiation heat generally vertically incident upon a normal line to the inner wall surface of the through hole is a main component (that is, the radiation heat passing along the axial direction of the through hole). Therefore, most of the heat radiation that has passed through the structural member 101 exposes (radiates) a limited area of the interior of the exhaust vessel 104' (that is, an area determined by an exist-side end face and the axial direction of the through hole of the structural member 101). Here, an end face (entrance-side end face) at a vacuum-pump-side of the structural member 101 is called a first end face, and the end face (exit-side end face) at the opposite side is called a second end face.

Accordingly, the heat radiation generated from the vacuum pump 102 is such that an oblique component is limited by the structural member 101 and such that a portion thereof in the axial direction of the through hole of the structural member 101 is a main component. The heat is radiated to the limited area of the interior of the exhaust vessel 104'. It is desirable that the through hole of the structural member 101 be oriented in a direction in which the influence of radiation heat is small, instead of orienting it towards an element (such as the projection optical system 109) in the vacuum vessel 104. For example, the vacuum pump 102 that performs an exhaust operation from the exhaust vessel through the structural member 101 is disposed so as to be oriented in a second direction differing from a first direction being an exhaust direction from the vacuum vessel to the exhaust vessel. The structural member 101 is formed with a shape (structure) that allows the radiation heat moving from the vacuum pump 102 to the first direction to be absorbed and that allows particles to pass in the second direction.

Here, a portion where the vacuum pump (such as a turbo molecular pump or a cryopump) is mounted is ordinarily formed by a normalized circular (annular or circular cylindrical) flange component. In this case, a space having a circular cylindrical shape or a shape that is similar to the circular cylindrical shape often exists near an opening of the flange component. By this, it is desirable to provide the structural member 101 in or near this space from the viewpoint of eliminating this space. Although the case in which the exhaust apparatus is connected to the exhaust vessel (vacuum vessel) through the circular cylindrical flange component will hereunder be described as an example, this description is not given to limit connection conditions and the shape/disposition of the structural member 101.

Figure 7:
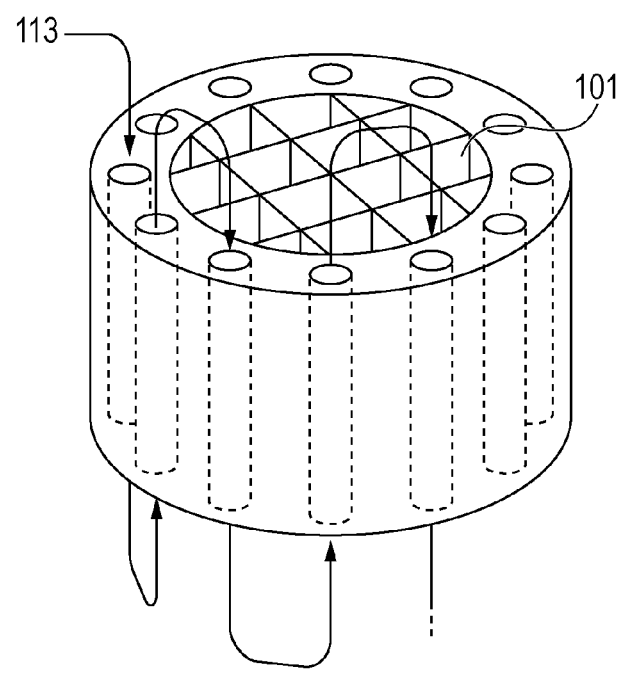
FIG. 7 shows an exemplary temperature regulation of the structural member.

For primarily being cooled or heated by heat radiation between the structural member 101 and the vacuum pump 102, the structural member 101 is provided with a regulator (temperature regulator or regulating device) 103 for regulating the temperature of the structural member 101. For example, by only contacting a sufficient area of the structural member 101 with the inner wall of the exhaust vessel 104', the exhaust vessel 104' is generally maintained at the same temperature by conduction of heat. However, if, for example, as shown in FIG. 7, a structure in which a medium (such as a liquid), whose temperature is regulated, circulates in the vicinity of the structural member 101 is provided, it is possible to regulate the temperature more accurately and precisely. Here, reference numeral 113 denotes an example of a member that forms a flow path of the medium whose temperature is regulated. This is merely an example of the temperature regulating device (mechanism). Therefore, a temperature regulating device of a suitable type may be provided as required.

For the structural member 101, it is desirable to use a metallic or nonmetallic (such as stainless steel, copper, aluminum, ceramics) plate material, which can be used under a high vacuum, or an object processed from the plate material. A surface of the structural member 101 may be such that any one of the following is realized: its base material is exposed; its base material is polished; a surface of its base material is roughened by shot blasting; or a surface of its base material is subjected to, for example, a modification operation or an adhesion (coating) operation.

Emissivity $\epsilon$ at the inner wall surface of the through hole of the structural member 101 is, for example, desirably a high emissivity of 0.6 or above for the purpose of absorbing as much radiation heat from the vacuum pump 102 as possible.

For reliably reducing the influence of heat from the vacuum pump 102, it is desirable that the heat recovering plate 111 (may also be called a heat-radiating member) be mounted in the exhaust vessel 104'. Since a radiation range of the heat from the vacuum pump 102 is limited by the structural member 101, the heat recovering plate 111 may be set at a position that is relatively separated from the vacuum pump 102, such as a position that is separated by at least a distance that is larger than an opening diameter of the exhaust apparatus. Therefore, it is possible to reduce a reduction in the exhaust efficiency of the exhaust apparatus.

Figure 8:
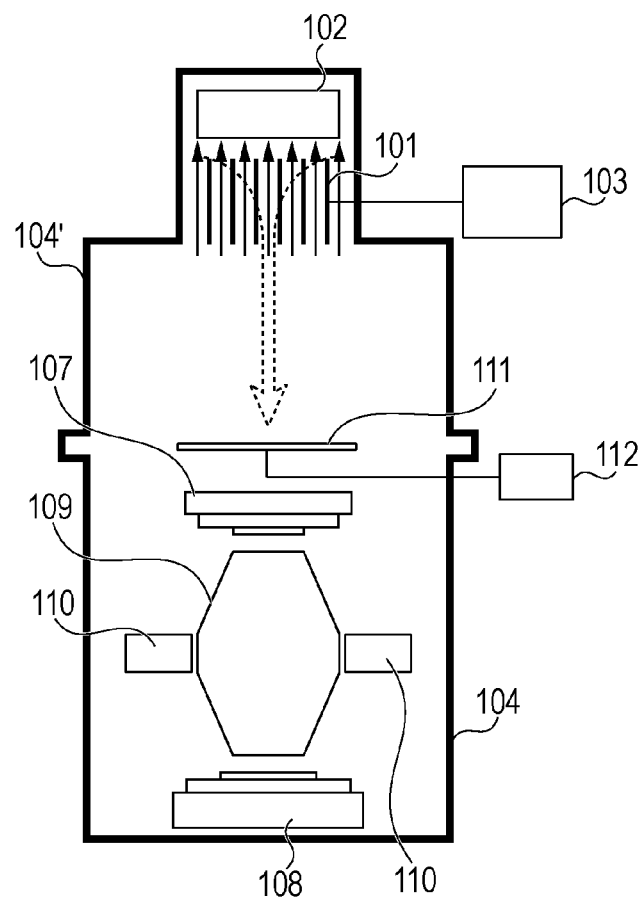
FIG. 8 shows another exemplary structure of a processing apparatus (exposure apparatus).

The heat recovering plate 111 need not be provided near a wall surface in the exhaust vessel 104'. For example, as shown in FIG. 8, if an element (such as the projection optical system 109) in which a temperature change is not desirable exists facing the opening of the exhaust apparatus, and if a sufficient space can be provided near the opening of the exhaust apparatus, the heat recovering plate 111 may be disposed between the exhaust apparatus and this element. Here, it is desirable that the opening of the exhaust apparatus and the heat recovering plate 111 be separated from each other by a distance that is at least equal to or greater than the opening diameter of the exhaust apparatus. Even in this case, a temperature regulator 112 (fourth regulating device) that regulates the temperature of the heat recovering plate 111 may be provided.

As long as this purpose is realized, the heat recovering plate 111 may have its temperature regulated by any temperature regulator 112. The temperature regulator may, for example, use circulating liquid or circulating gas, include a Peltier element, or include a heat movement mechanism, such as a heat pipe.

For the heat recovering plate 111, it is desirable to use a metallic or nonmetallic (such as stainless steel, copper, aluminum, ceramics) processed object which can be used under a high vacuum. A surface of the heat recovering plate 111 may be such that any one of the following is realized: its base material is exposed; its base material is polished; a surface of its base material is roughened by shot blasting; or a surface of its base material is subjected to, for example, a modification operation or an adhesion (coating) operation.

Emissivity $\epsilon$ at the surface of the heat recovering plate 111 is, for example, desirably a high emissivity of 0.6 or above for the purpose of absorbing as much radiation heat from the vacuum pump 102 as possible.

Figure 9:
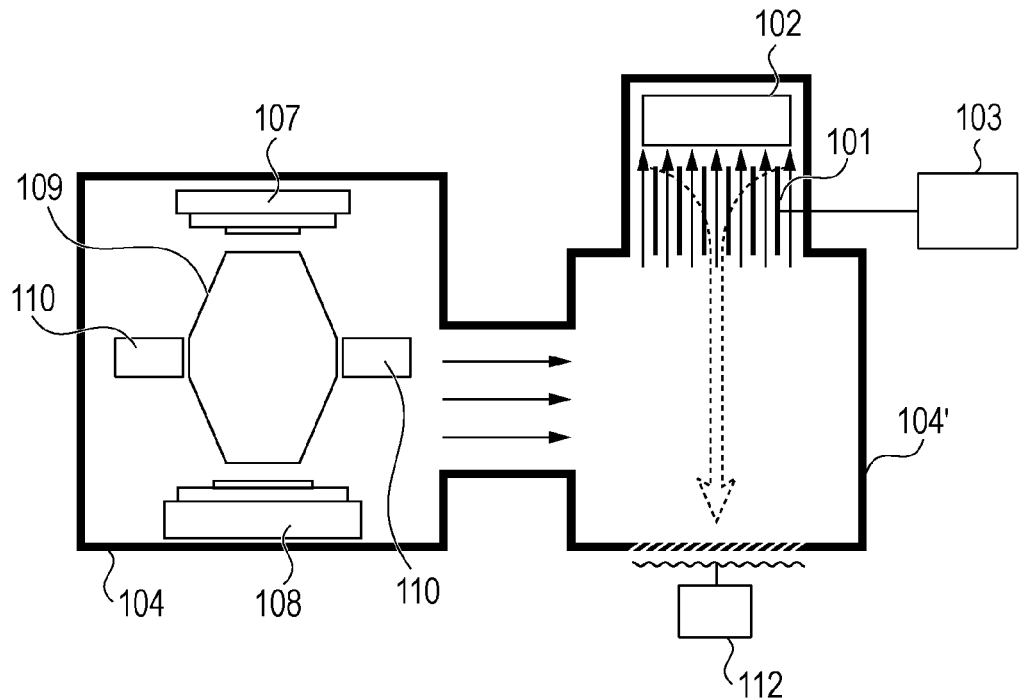
FIG. 9 shows still another exemplary structure of a processing apparatus (exposure apparatus).

Even if the heat recovering plate 111 is not provided, if, for example, as shown in FIG. 9, the temperature of the inner wall surface of the exhaust vessel 104' is regulated, a structure in which the heat from the vacuum pump 102 is directly radiated with respect to the inner wall surface of the exhaust vessel 104' may be used. Even in this case, advantages like those provided when the heat recovering plate 111 is disposed can be provided. Even in this case, for example, the material/surface/emissivity of the exhaust vessel 104' in at least an area of a portion upon which heat radiation is incident from the vacuum pump 102, and the structure of the temperature regulator 112 (third regulating device or fifth regulating device) are similar to those when the aforementioned heat recovering plate 111 is disposed.

Figure 10:
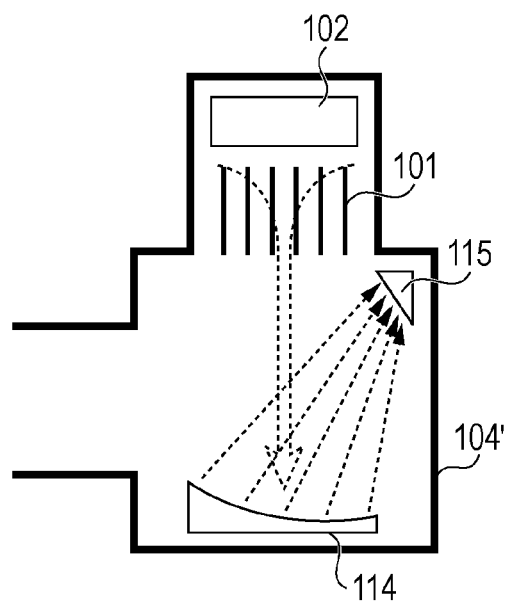
FIG. 10 shows an exemplary structure for recovering radiation heat.

As an exemplary structure serving as an alternative of the structure including the temperature regulator 112, as shown in FIG. 10, a structure in which a heat reflector 114 facing a vacuum pump 102 is provided and heat reflected by the heat reflector 114 is received by another heat-radiating member 115 (that is, absorbs/dissipates the heat) may be used. The heat-radiating member 115 may include a temperature regulator. In this structure, a plurality of heat reflectors may be provided, or one heat reflector may include a temperature regulator, or each heat reflector may include a temperature regulator. A suitable heat recovering mechanism including such a heat-radiating member or radiating-members may be disposed when necessary.

It is desirable for the structural member 101 to have a suitable form considering the characteristics of the vacuum pump 102. Exemplary forms of structural members 101 are shown in FIGS. 11A to 11J. FIGS. 11A to 11J are schematic views of the forms of the structural members 101. For example, the shape of the through hole, an opening size ratio, and manufacturing method can be appropriately selected in accordance with the use thereof.

Figure 11A:
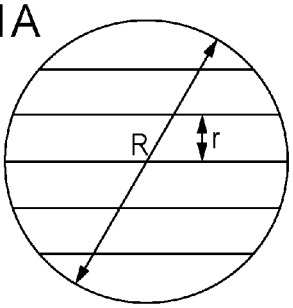
FIGS. 11A to 11J show other exemplary structural members.

FIG. 11A is a sectional view of the structural member 101 capable of being realized by providing, for example, at least one plate material or a processed plate in a round (circular cylindrical) flange. R denotes an outside diameter of the structural member 101, and this also applies to FIGS. 11B to 11J. Intervals r at a plate surface where a through hole of the structural member 101 is formed may be equal or unequal to each other in the structural member 101.

Figure 11B:
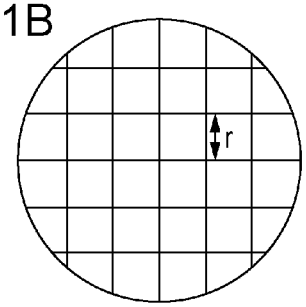

FIG. 11B is a sectional view of the structural member 101 having, for example, a shape in which a plate material or a processed plate is disposed in a round flange so that crossing occurs at at least one location. The structural member 101 may have a lattice structure formed by arranging square shapes or other shapes. Lattice sizes r may be equal or unequal to each other in the structural member 101.

Figure 11C:
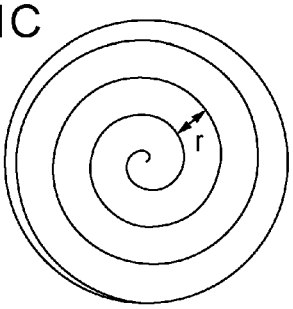

FIG. 11C is a sectional view of the structural member 101 in which, for example, a plate material or a processed plate (at least one) is spirally formed and disposed in a round flange. Plate surface intervals r may be equal or unequal to each other in the structural member 101.

Figure 11D:
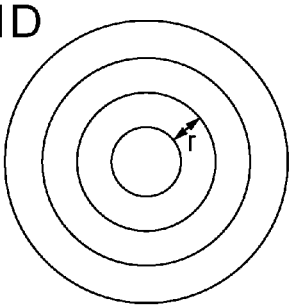
Figure 11E:
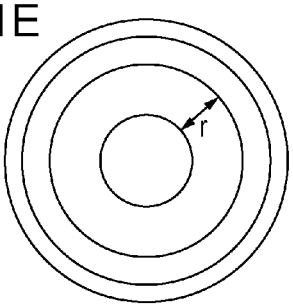

FIGS. 11D and 11E are each a sectional view of the structural member 101 in which, for example, a plate material or a processed plate (at least one) is formed in a cylindrical shape and is disposed in the form of a nest in a round flange. Plate surface intervals r may be equal to each other in the structural member 101 as shown in FIG. 11D or may be unequal to each other in the structural member 101 as shown in FIG. 11E. A plurality of cylindrical plates may be concentrically or eccentrically formed with respect to each other.

Figure 11F:
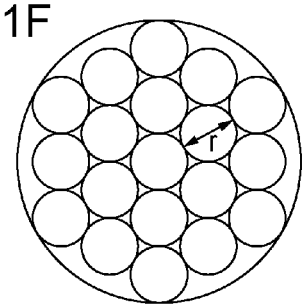

FIG. 11F is a sectional view of the structural member 101 in which, for example, plate materials or processed plates are cylindrically formed and are bundled and disposed in a round flange. Opening sizes r of through holes may be equal or unequal to each other in the structural member 101.

Figure 11G:
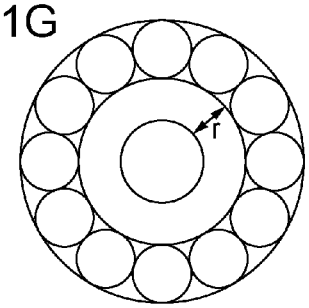

FIG. 11G is a sectional view of the structural member 101 realized by combining a plurality of structures (shapes) that have already been discussed. In these structures, opening sizes r of through holes may be equal or unequal to each other.

Figure 11H:
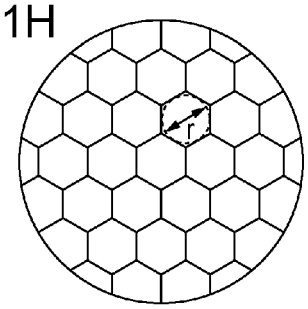

FIG. 11H is a sectional view of the structural member 101 in which, for example, a plate material or a processed plate (at least one) is formed with a hexagonal honeycomb structure and disposed in a round flange. Opening sizes r of hexagonal structural elements may be equal or unequal to each other in the structural member 101.

Figure 11I:
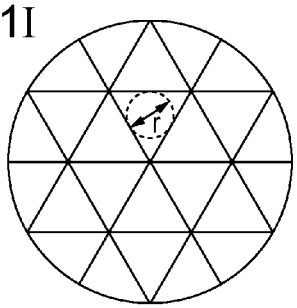

FIG. 11I is a sectional view of the structural member 101 in which, for example, a plate material or a processed plate (at least one) is formed with a triangular lattice structure and disposed in a round flange. Opening sizes r of triangular structural elements may be equal or unequal to each other in the structural member 101.

Figure 11J:
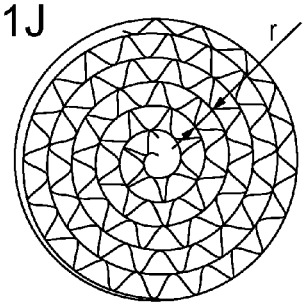

FIG. 11J is a sectional view of the structural member 101 in which, for example, a plate material or a processed plate (at least one) is formed in a wavy form (wavy plate form) and is spirally disposed in a round flange. Plate surface intervals r of spiral portions may be equal to unequal to each other in the structural member 101.

Figure 12:
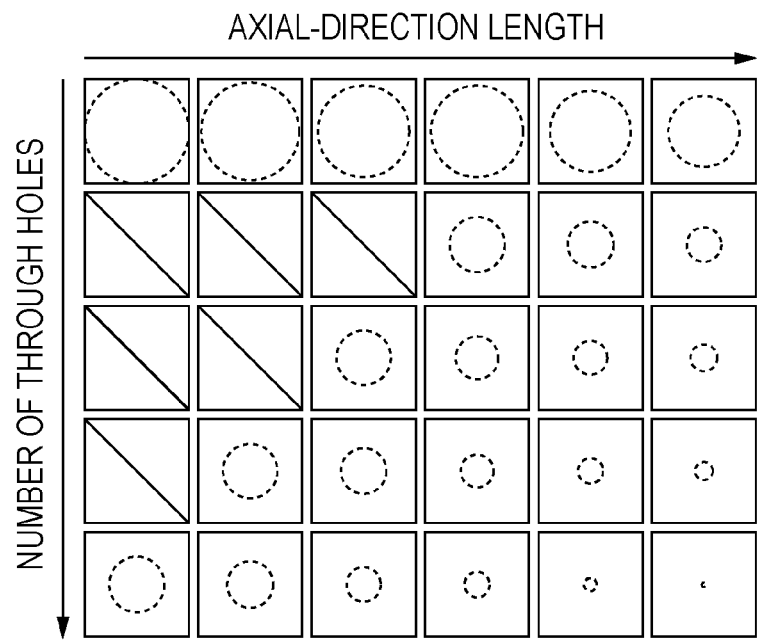
FIG. 12 shows exemplary calculation results of heat-radiation illuminance at a facing surface.

FIG. 12 shows exemplary calculation results of heat-radiation illuminance obtained at a surface facing the second end face (exit-side end face) of the structural member 101 when the structural member 101 illustrated in FIG. 11B is provided with openings of a turbo molecular pump. Broken lines (circles) are boundary lines at particular illuminance threshold values. By increasing the number of partition plates in the round flange, the number of through holes in the structural member 101 is increased, so that the diameter of each through hole is reduced. From the calculation results, it can be understood that, when the number of through holes is increased (the through hole diameters are reduced) or the lengths of the through holes in an axial direction are increased, heat quantity that the facing surface receives can be reduced.

Figure 13:
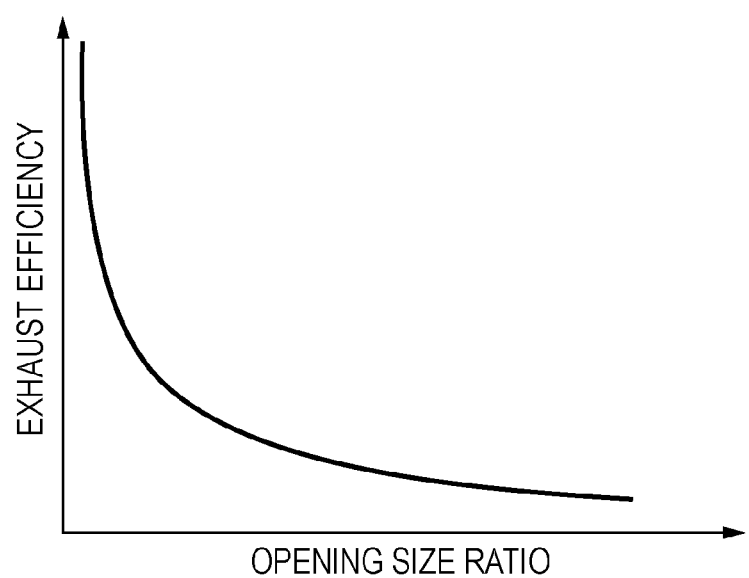
FIG. 13 shows exemplary calculation results of exhaust efficiency.

FIG. 13 shows exemplary calculation results of exhaust efficiency for the structural member 101 having a shape similar to that used in calculating the illuminance. The exhaust efficiency depends upon the opening size ratio. On the basis of the results in FIGS. 12 and 13, it is possible to select the shape and size of the structural member 101 so as to satisfy conditions suitable for thermal environment and vacuum environment in the vessel.

Figure 14:
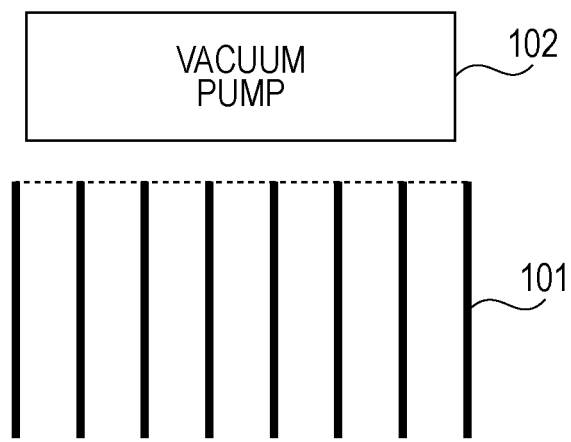
FIG. 14 shows an exemplary shape of an end face of a structural member.
Figure 15:
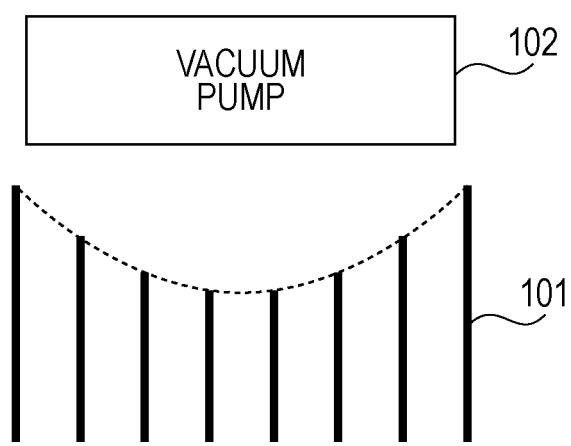
FIG. 15 shows another exemplary shape of the end face of the structural member.

FIGS. 14 and 15 are sectional views of exemplary structures of the exhaust apparatus. Here, for example, as shown in FIG. 14, the shapes of the first and second end faces of the structural member 101 may both be flat. However, as shown in FIG. 15, the vacuum-pump-102-side (first end face) of the structural member 101 may be have a recessed form (recessed surface). Alternatively, the first end face of the structural member 101 may have a protruding form (protruding surface) or irregular recesses and protrusions. Still alternatively, the end face (second end face) opposite to the vacuum pump 102 may have various forms.

Exemplary structures of the exhaust apparatus in the vacuum exposure apparatus (such as an EUV exposure apparatus) are described above. However, the exhaust apparatus described above is widely applicable to a vacuum apparatus, for example, other processing apparatuses that process objects under a vacuum environment.

Embodiment of Device Manufacturing Method

Next, a device (semiconductor device, liquid crystal display device, etc.) manufacturing method according to an embodiment of the present invention will be described. In the method, the exposure apparatus to which the present invention is applied can be used.

A semiconductor device is manufactured by a pre-processing step of forming an integrated circuit on a wafer (semiconductor substrate) and a post-processing step of finishing as a product an integrated circuit chip on the wafer formed in the pre-processing step. The pre-processing step may include a step of exposing the wafer to which photoresist is applied using the exposure apparatus and a step of developing the wafer exposed in the exposure step. The post-processing step may include an assembly step (dicing, bonding) and a packaging step (enclosing step). The liquid crystal display device is manufactured by a step of forming a transparent electrode. The step of forming a transparent electrode may include a step of applying photoresist to a glass substrate at which a transparent electroconductive film is evaporated, a step of exposing the glass substrate to which the photoresist is applied using the exposure apparatus, and a step of developing the glass substrate that has been exposed in the exposure step.

The device manufacturing method according to the embodiment is advantageous compared to a related manufacturing method in terms of at least one of device performance, productivity, quality, and production cost.

While desirable embodiments of the present invention have been described above, it is to be understood that the invention is not limited to the disclosed exemplary embodiments. Any modification or variation within the scope of the invention should be possible.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims priority from Japanese Patent Application No. 2008-330368, entitled "EXHAUST APPARATUS, PROCESSING DEVICE, AND DEVICE MANUFACTURING METHOD" and filed on Dec. 25, 2008, the entire contents of which are incorporated herein by reference.

What is claimed is:

1. A processing apparatus that includes a vacuum vessel and processes an object in the vacuum vessel, the apparatus comprising:
   an exhaust apparatus for exhausting a gas from the vacuum vessel, the exhaust apparatus comprising:
      a structural member;
      a vacuum pump configured to exhaust a gas via the structural member; and
      a first regulator configured to regulate a temperature of the structural member,
      wherein the structural member has first and second end faces and a columnar through hole connecting the first and second end faces to each other, and
      wherein the exhaust apparatus is configured such that the vacuum pump exhausts a gas via the through hole;
   a heat-radiating member arranged in the vacuum vessel so as to be separated from and so as to face the second end face; and
   a second regulator configured to regulate a temperature of the heat-radiating member.

2. The processing apparatus according to claim 1, wherein the through hole is a hollow circular cylinder, and
   wherein the structural member includes a bundle of the circular cylinders.

3. The processing apparatus according to claim 1, wherein the structural member has a flow path for a medium, and
   wherein the first regulator is configured to cause the medium whose temperature is regulated to flow via the flow path.

4. The processing apparatus according to claim 1, further comprising:
   a third regulator configured to regulate a temperature of the vacuum vessel,
   wherein a portion of the vacuum vessel and the second end face are separated from each other and face each other.

5. A processing apparatus that includes a vacuum vessel and processes an object in the vacuum vessel, the apparatus comprising:
   an exhaust vessel connected to the vacuum vessel;
   an exhaust apparatus connected to the exhaust vessel for exhausting a gas from the vacuum vessel, the exhaust apparatus comprising:
      a structural member;
      a vacuum pump configured to exhaust a gas via the structural member; and
      a first regulator configured to regulate a temperature of the structural member,
      wherein the structural member has first and second end faces and a columnar through hole connecting the first and second end faces to each other, and
      wherein the exhaust apparatus is configured such that the vacuum pump exhausts a gas via the through hole;
   a heat-radiating member arranged in the exhaust vessel so as to be separated from and so as to face the second end face; and
   a fourth regulator configured to regulate a temperature of the heat-radiating member.

6. A processing apparatus that includes a vacuum vessel and processes an object in the vacuum vessel, the apparatus comprising:
   an exhaust vessel connected to the vacuum vessel;
   an exhaust apparatus connected to the exhaust vessel for exhausting a gas from the vacuum vessel, the exhaust apparatus comprising:
      a structural member;
      a vacuum pump configured to exhaust a gas via the structural member; and
      a first regulator configured to regulate a temperature of the structural member,
      wherein the structural member has first and second end faces and a columnar through hole connecting the first and second end faces to each other, and
      wherein the exhaust apparatus is configured such that the vacuum pump exhausts a gas via the through hole; and
   a fifth regulator configured to regulate a temperature of the exhaust vessel,
   wherein a portion of the exhaust vessel and the second end face are separated from each other and face each other.

7. A method of manufacturing a device, the method comprising:
   exposing a substrate to radiant energy to transfer a pattern to the substrate using a processing apparatus that includes a vacuum vessel and processes an object in the vacuum vessel, the processing apparatus comprising:
      an exhaust vessel connected to the vacuum vessel;
      an exhaust apparatus connected to the exhaust vessel for exhausting a gas from the vacuum vessel, the exhaust apparatus comprising:
         a structural member;
         a vacuum pump configured to exhaust a gas via the structural member; and
         a first regulator configured to regulate a temperature of the structural member,
         wherein the structural member has first and second end faces and a columnar through hole connecting the first and second end faces to each other, and
         wherein the exhaust apparatus is configured such that the vacuum pump exhausts a gas via the through hole;
      a fifth regulator configured to regulate a temperature of the exhaust vessel,
      wherein a portion of the exhaust vessel and the second end face are separated from each other and face each other;
      a projection system arranged in the vacuum vessel and configured to project radiant energy onto the substrate,
      wherein the processing apparatus is configured to transfer the pattern to the substrate by the projection system in the vacuum vessel;
   developing the exposed substrate; and
   processing the developed substrate to manufacture the device.

8. A processing apparatus that includes a vacuum vessel and processes an object in the vacuum vessel, the apparatus comprising:
   an exhaust vessel connected to the vacuum vessel;
   a structural member;
   a vacuum pump configured to exhaust a gas from the exhaust vessel via the structural member, the vacuum pump being arranged so as to be oriented in a second direction that differs from a first direction that is an exhaust direction from the vacuum vessel to the exhaust vessel;

a first regulator configured to regulate a temperature of the structural member, wherein the structural member is configured to absorb radiation heat from the vacuum pump along the first direction and to cause a particle to pass along the second direction;

a heat-radiating member arranged in the exhaust vessel so as to be separated from and so as to face the structural member in the second direction; and a second regulator configured to regulate a temperature of the heat-radiating member.

9. The processing apparatus according to claim 8, further comprising a projection system arranged in the vacuum vessel and configured to project radiant energy onto a substrate, wherein the processing apparatus is configured to transfer a pattern to the substrate by the projection system in the vacuum vessel.

10. A processing apparatus that includes a vacuum vessel and processes an object in the vacuum vessel, the apparatus comprising:

an exhaust vessel connected to the vacuum vessel;

a structural member;

a vacuum pump configured to exhaust a gas from the exhaust vessel via the structural member, the vacuum pump being arranged so as to be oriented in a second direction that differs from a first direction that is an exhaust direction from the vacuum vessel to the exhaust vessel;

a first regulator configured to regulate a temperature of the structural member, wherein the structural member is configured to absorb radiation heat from the vacuum pump along the first direction and to cause a particle to pass along the second direction; and a third regulator configured to regulate a temperature of the exhaust vessel, wherein a portion of the exhaust vessel and the structural member are separated from each other and face each other in the second direction.

11. The processing apparatus according to claim 10, further comprising a projection system arranged in the vacuum vessel and configured to project radiant energy onto a substrate, wherein the processing apparatus is configured to transfer a pattern to the substrate by the projection system in the vacuum vessel.

12. A method of manufacturing a device, the method comprising:

exposing a substrate to radiant energy to transfer a pattern to the substrate using a processing apparatus that includes a vacuum vessel and processes an object in the vacuum vessel, the apparatus comprising:

an exhaust vessel connected to the vacuum vessel;

a structural member;

a vacuum pump configured to exhaust a gas from the exhaust vessel via the structural member, the vacuum pump being arranged so as to be oriented in a second direction that differs from a first direction that is an exhaust direction from the vacuum vessel to the exhaust vessel;

a first regulator configured to regulate a temperature of the structural member, wherein the structural member is configured to absorb radiation heat from the vacuum pump along the first direction and to cause a particle to pass along the second direction;

a heat-radiating member arranged in the exhaust vessel so as to be separated from and so as to face the structural member in the second direction; and a second regulator configured to regulate a temperature of the heat-radiating member;

developing the exposed substrate; and processing the developed substrate to manufacture the device.

13. A method of manufacturing a device, the method comprising:

exposing a substrate to radiant energy to transfer a pattern to the substrate using a processing apparatus that includes a vacuum vessel and processes an object in the vacuum vessel, the apparatus comprising:

an exhaust vessel connected to the vacuum vessel;

a structural member;

a vacuum pump configured to exhaust a gas from the exhaust vessel via the structural member, the vacuum pump being arranged so as to be oriented in a second direction that differs from a first direction that is an exhaust direction from the vacuum vessel to the exhaust vessel;

a first regulator configured to regulate a temperature of the structural member, wherein the structural member is configured to absorb radiation heat from the vacuum pump along the first direction and to cause a particle to pass along the second direction; and a third regulator configured to regulate a temperature of the exhaust vessel, wherein a portion of the exhaust vessel and the structural member are separated from each other and face each other in the second direction;

developing the exposed substrate; and processing the developed substrate to manufacture the device.

* * * * *